United States Patent
Puggl et al.

(10) Patent No.: US 8,821,681 B2
(45) Date of Patent: Sep. 2, 2014

(54) APPARATUS AND METHOD FOR WET TREATMENT OF DISC-LIKE ARTICLES

(75) Inventors: Michael Puggl, Eitweg (AT); Alexander Schwartzfurtner, Moosburg (AT); Dieter Frank, Villach (AT)

(73) Assignee: Lam Research AG, Villach (AT)

( * ) Notice: Subject to any disclaimer, the term of this patent is extended or adjusted under 35 U.S.C. 154(b) by 887 days.

(21) Appl. No.: 12/668,940

(22) PCT Filed: Jul. 3, 2008

(86) PCT No.: PCT/EP2008/058568
§ 371 (c)(1),
(2), (4) Date: Jan. 13, 2010

(87) PCT Pub. No.: WO2009/010394
PCT Pub. Date: Jan. 22, 2009

(65) Prior Publication Data
US 2010/0200163 A1 Aug. 12, 2010

(30) Foreign Application Priority Data

Jul. 13, 2007 (AT) ................................ A 1104/2007

(51) Int. Cl.
*B08B 3/02* (2006.01)
*C23F 1/08* (2006.01)
*B08B 13/00* (2006.01)

(52) U.S. Cl.
USPC ............ 156/345.21; 156/345.55; 156/345.23; 134/157; 134/99.1

(58) Field of Classification Search
USPC ........... 156/345.21, 345.55, 345.23; 134/157, 134/99.1
See application file for complete search history.

(56) References Cited

U.S. PATENT DOCUMENTS

| 4,903,717 A | 2/1990 | Sumnitsch |
| 5,927,305 A | 7/1999 | Shiba |

(Continued)

FOREIGN PATENT DOCUMENTS

| JP | 63-185029 | 7/1988 |
| JP | 2001-319910 | 11/2001 |
| JP | 2001319909 A | 11/2001 |
| JP | 2006148010 A | 6/2006 |

OTHER PUBLICATIONS

Machine Generated English Translation of JP 2001-319910A held to Taniyama Hiromi et al. Published Nov. 16, 2001.*

(Continued)

*Primary Examiner* — Sylvia R MacArthur
(74) *Attorney, Agent, or Firm* — Young & Thompson

(57) ABSTRACT

Disclosed is an apparatus for wet treatment of a disc-like article, which comprises: a spin chuck for holding and rotating the disc-like article, and an inner edge nozzle dispensing treatment liquid directed towards a first peripheral region of the first surface of the disc-like article, wherein the first surface is facing the spin chuck and the first peripheral region is defined as being a region of the first surface with an inner radius (ri), which is greater than 1 cm less than the disc-like article's radius (ra), wherein the inner edge nozzle is positioned in a stationary manner between the disc-like article (when placed on the spin chuck) and the spin chuck, wherein the inner edge nozzle is feed through a central pipe, which is disposed in a stationary manner and penetrates centrally through the spin chuck, for supplying a treatment liquid against a first surface of the disc-like article.

14 Claims, 3 Drawing Sheets

(56) References Cited

U.S. PATENT DOCUMENTS

| | | |
|---|---|---|
| 6,357,457 B1 | 3/2002 | Taniyama et al. |
| 6,435,200 B1 | 8/2002 | Langen |
| 2002/0002991 A1 | 1/2002 | Lindner |
| 2003/0196683 A1 | 10/2003 | Izumi et al. |
| 2004/0250839 A1 | 12/2004 | Robertson et al. |
| 2008/0110861 A1* | 5/2008 | Kajita et al. .................... 216/83 |
| 2010/0200163 A1* | 8/2010 | Puggi et al. .............. 156/345.21 |

OTHER PUBLICATIONS

International Search Report dated Aug. 28, 2008, from corresponding PCT application.

Translation of Japanese Office Action, dated Oct. 23, 2012, from corresponding JP application.

* cited by examiner

APPARATUS AND METHOD FOR WET TREATMENT OF DISC-LIKE ARTICLES

TECHNICAL FIELD

The invention relates to an apparatus for wet treating of a single disc-like article, comprising a spin chuck for holding and rotating the disc-like article, . . . .

The term wet treating basically means wetting the disc-like article in order to clean or etch or dispose of a material.

If in the following the term wafer is used such disc-like articles are meant.

Such disc-like articles can be semiconductor wafers, or compact discs as well as polygonal articles such as flat panel displays or reticles.

BACKGROUND ART

U.S. Pat. No. 6,435,200 discloses an apparatus for etching a peripheral region of a disc-like article. The liquid is supplied to the surface of the disc-like article which does not face the chuck and is held in a gap between the disc-like article and a ring.

For specific application a mechanical force is advantageous in order to properly treat the peripheral region, e.g. in order to remove a specific layer from the peripheral region.

DISCLOSURE OF INVENTION

The invention meets the objects by providing an apparatus for wet treatment of a single disc-like article comprising a spin chuck for holding and rotating the disc-like article, and an inner edge nozzle dispensing treatment liquid directed towards a first peripheral region of the first surface of the disc-like article, wherein the first surface is facing the spin chuck and the first peripheral region is defined as being a region of the first surface with an inner radius ($r_i$), and an outer radius being the disc-like article's radius ($r_a$), wherein ($r_a$)-($r_i$)>1 cm, and wherein the inner edge nozzle is positioned in a stationary manner between the disc-like article (when placed on the spin chuck) and the spin chuck, wherein the inner edge nozzle is fed through a central pipe, which is disposed in a stationary manner and penetrates centrally through the spin chuck, for supplying a treatment liquid against a first surface of the disc-like article.

One example of an applicable spin chuck is disclosed in U.S. Pat. No. 6,536,454. If the spin chuck is facing up and thus the disc-like article is put on top of the spin chuck the surface of the disc-like article, which shall be treated by the inner edge nozzle is then the bottom surface of the disc-like article. The central pipe can simultaneously support the inner edge nozzle. The central pipe, which axially leads through the spin chuck, may be connected to the inner edge nozzle trough a radial pipe. If the radial pipe simultaneously serves as support of the inner edge nozzle the radial pipe must be then rigid enough so that neither the nozzle nor the radial pipe itself can touch either the disc-like article (when placed on the spin chuck) or the surface of the spin chuck, which faces the disc-like article.

An advantage of the current invention is that the peripheral region of the disc-like article can be treated on both sides without contacting one side of the disc-like article, wherein the liquid flow is not obstructed.

Preferably the spin chuck comprises at least two gripping elements projecting from the spin chuck for gripping the disc-like article at its edge. Such gripping elements can be fixed to the spin chuck, meaning that the gripping elements are not radially movable with respect to the rotation axis of the spin chuck. However, the gripping elements can be radially movable with respect to the rotation axis of the spin chuck which brings the advantage that the disc-like article is held more securely. If the gripping elements are pin-shaped preferably three pins are used.

The apparatus may further comprise an outer nozzle directed to a second surface of the disc-like article, which is not facing the spin chuck. In this case the disc-like article can simultaneously be treated on both sides, e.g. on one side only on its peripheral region and on the other side all over the disc-like article. The nozzle can be fixed or movably mounted.

If said outer nozzle is movable mounted so that it can move across the disc-like article each region of the surface of the disc-like article not facing the chuck can directly be reached by the liquid dispensed from the outer nozzle.

The outer nozzle can be an outer edge nozzle dispensing treatment liquid. The nozzle is then directed towards a second peripheral region of the first surface of the disc-like article, wherein the second peripheral region is defined as being a region of the second surface with an inner radius, which is greater than 1 cm less than the disc-like article's radius. Therefore both peripheral regions of the disc-like article can be simultaneously or alternatively treated with or without simultaneously treating the inner regions of the respective surfaces.

Advantageously the axis of the inner edge nozzle and the first surface include an angle $\alpha$ in a range of 5° to 85°. To provide such an acute angle $\alpha$ brings the advantage to avoid splashes. However, it shall be understood that it might be necessary to optimize that angle $\alpha$ with respect to process parameters such as spin speed, volume flow, flow speed, liquid parameters (e.g. viscosity, surface energy), required mechanical impact.

In one embodiment the axis of the inner edge nozzle and the edge of the disc-like article include an angle $\beta$ in a range of 5° to 90°, preferably 10° to 80°. This can help to further optimize the required process results. Angle $\beta$ shall be defined as the angle included by the axis of the inner edge nozzle and the edge of the disc-like article both (axis and edge) when orthogonally projected towards the surface of the disc-like article.

In order to enhance the mechanical force applied to the peripheral region the apparatus comprises agitation means for agitating the liquid flow directed to the first peripheral region, wherein the agitation means comprises at least one of the elements selected from the group of liquid flow guided laser beam, megasonic transducer, gas jet and two fluid jet.

Alternative embodiments of the apparatus comprise two (or even more) inner edge nozzles and/or a gas purging device for supplying gas to the first surface of the disc-like article and/or an inner liquid nozzle for supplying liquid towards the inner region of the first surface of the disc-like article, the inner region being within the peripheral region (e.g. two or more inner liquid nozzles).

Two inner edge nozzles can help to fully wet the inner peripheral region. However, different liquids can be supplied alternatively and/or simultaneously through these two nozzles, e.g. if two different liquids are needed in order to remove two different species of material from the peripheral region.

The gas purging device for supplying gas to the first surface can help prevent contaminations of the inner region of the first surface due to back splashes from the inner edge nozzle. The inner liquid nozzle can be used for protecting the inner region of the first surface from back splashes with inert liquid (e.g.

DI-water, 2-propanol) and/or for cleaning and rinsing the first surface (including the peripheral region)

BEST MODE FOR CARRYING OUT THE INVENTION

FIG. 1, FIG. 2, FIG. 3 and FIG. 4 show different views of the core details of the wet treatment apparatus according to the present invention. The apparatus comprises a spin chuck 10, which is mounted to the rotor of a hollow-shaft motor 40 (schematically shown in FIG. 4), and a stationary nozzle head 20 which penetrates through a central hole of the spin chuck. The stator of the hollow-shaft motor 40 is mounted to the mounting plate 42 (schematically shown in FIG. 4).

Figure 1:
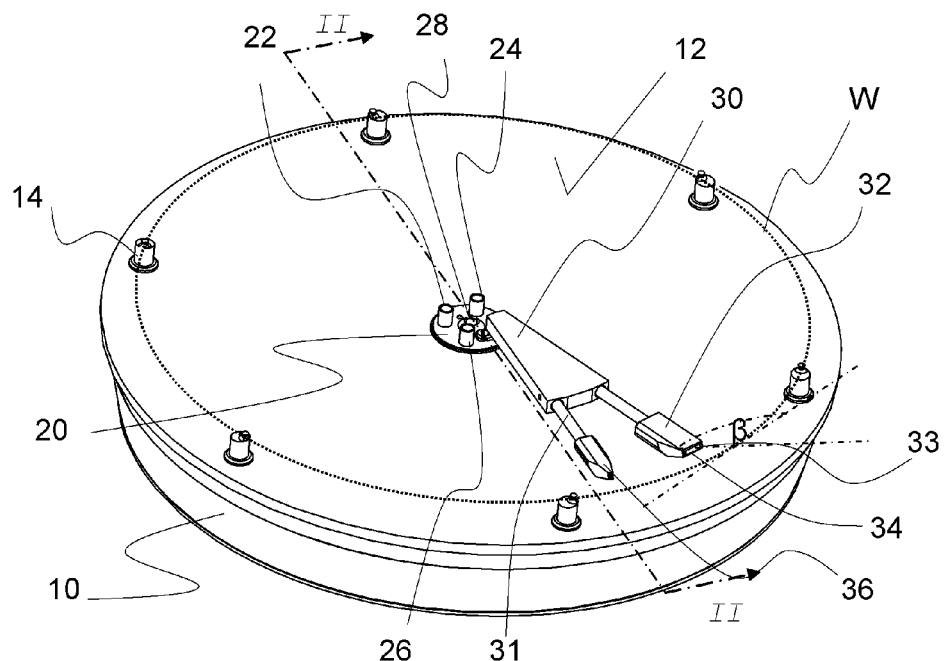
FIG. 1 shows details of a wet treatment apparatus according to the present invention in a perspective view.
Figure 2:
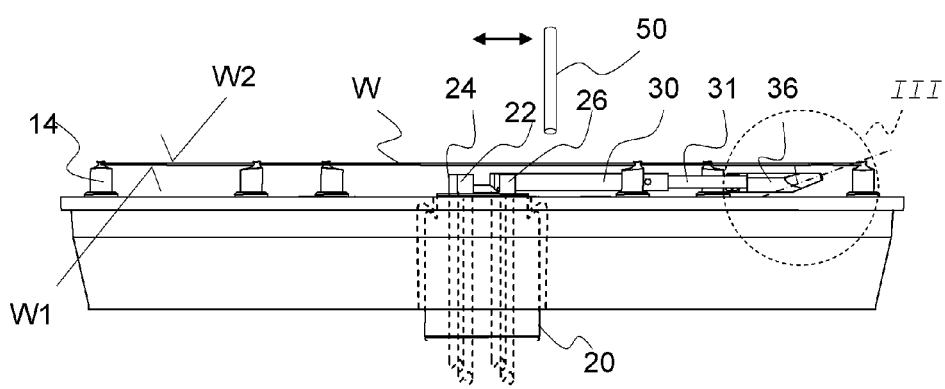
FIG. 2 shows details of a wet treatment apparatus according to the present invention in a side view in direction II-II as shown in FIG. 1.
Figure 3:
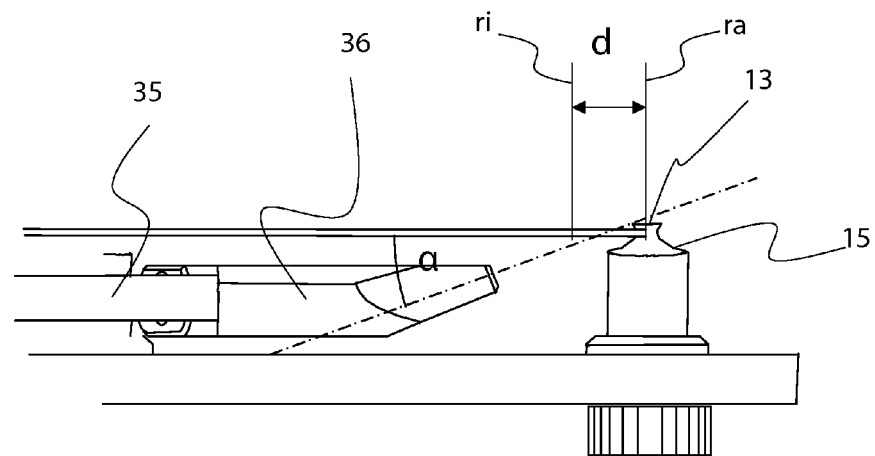
FIG. 3 shows a detailed view of detail III.
Figure 4:
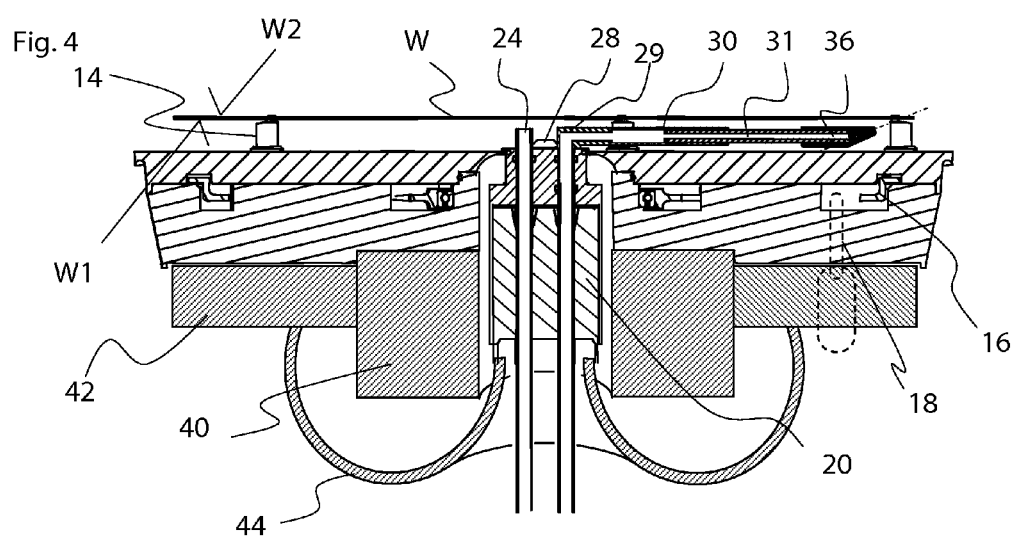
FIG. 4. shows details of a wet treatment apparatus according to the present invention in a cross-sectional side view in direction II-II as shown in FIG. 1.

Nozzle head 20 and mounting plate 42 are mounted to the same stationary frame 44 (schematically shown in FIG. 4).

For collecting spun off liquid a collecting chamber (annual duct—not shown) is concentrically arranged around the spin chuck. For spinning liquid into different vertically arranged annular ducts the stationary frame and the collecting chamber can be axially shifted against each other (as disclosed for instance in U.S. Pat. No. 4,903,717).

The spin chuck 10 comprises six cylindrically shaped holding elements 14 with eccentrically mounted gripping pins. The gripping pins are rotated about the holing elements' cylinder axis by a tooth gear 16. The tooth gear 16 is rotated against the base-body of the spin chuck by holding the tooth gear by a vertically movable rod 18 (penetrating through a not shown slit in the base-body) whilst slightly rotating the base-body with the hollow-shaft motor 40. Thereby the cylindrical holding elements 14 are rotated and the gripping pins 13 turn into open position. After a wafer has been placed on the top rests 15 of the holding elements 14 within the gripping pins the base body is turned back and the tooth gear turns into close position driven by helical springs (not shown). Thereby the gripping pins contact the wafer's edge and securely grip the wafer.

A non-rotating (stationary) nozzle head 20 penetrates through the centre hole of the spin chuck leaving a gap between the spin chuck and the nozzle head of 0.2 mm. The gap can be purged by gas (e.g. nitrogen) during process time. Five pipes 22, 24, 26, 28, 29 lead through the nozzle head. Pipes 22, 24, 26 are each connected to different liquid sources and project 5 mm over the top surface of the spin chuck as well as the nozzle head. The openings (nozzles) of pipes 22, 24, 26 are directed towards the downwardly facing surface of the wafer. Pipe 28 is centrally arranged and is connected to a gas source. Gas such as nitrogen or ultra clean air is lead through pipe 28 towards the down-facing surface W1 of the wafer.

Pipe 29 leads through the nozzle head 20 and above the nozzle head it turns radially outward towards the edge of the wafer as radial pipe 30 and nozzle arm. At a distance of about 50 mm to the rotation axis of the spin chuck pipe 30 splits into two branches ending in two nozzles 32 and 36. Nozzle 32 has two openings 33 and 34 whereas nozzle 36 in the shown embodiment has one opening. Therefore the shown embodiment has three inner edge nozzles (33, 34, and 36). Radial pipe 30 is rigid enough to carry the inner edge nozzles so that they do neither touch the chuck nor the wafer.

The nozzles are easily changeable for optimizing the angle α at which the liquid is supplied to the peripheral region of the down-facing surface W1 of the wafer. In the shown embodiment the angle α is about 30°.

Another nozzle assembly 50 (schematically shown in FIG. 2) is provided above the spin chuck in order to supply liquid and/or gas to the upwardly-facing surface W2 of the wafer.

In the following a process for treating the wafer shall be described. A wafer is placed on the spin chuck 10, resting on top rests 15 and securely held by gripping pins 13. The spin chuck is rotated at a spin speed of 300 rpm. Etching liquid is supplied to the centre of the first surface at volume flow of 1500 ml/min through nozzle 50. Then the nozzle 50 radially moves across the wafer. Simultaneously a second flow of etching liquid is supplied through the inner edge nozzles 33, 34, 36. Each inner edge nozzle supplies liquid at a volume flow of 50 ml/min for a time of 60 s. Optionally thereafter the entire lower surface W1 is cleaned with a cleaning liquid supplied through nozzle 22 for 30 s at a spin speed of 500 rpm. Alternatively a second treatment liquid (for cleaning or etching) can be supplied through nozzle 26.

After the etching step rinsing liquid (e.g. deionised water) is supplied to both sides W1 and W2 of the wafer through an upper nozzle (similar to nozzle 50) and through the lower nozzle 24 for 20 s at a spin speed of 500 rpm. Thereafter nitrogen is supplied through nozzle 28 at a volume flow of 10 l/min for removing the rinsing liquid while the spin speed is at 1500 rpm.

During the whole process nitrogen may be supplied at a volume flow of 0.1 l/min.

MODE(S) FOR CARRYING OUT THE INVENTION

Figure 5:
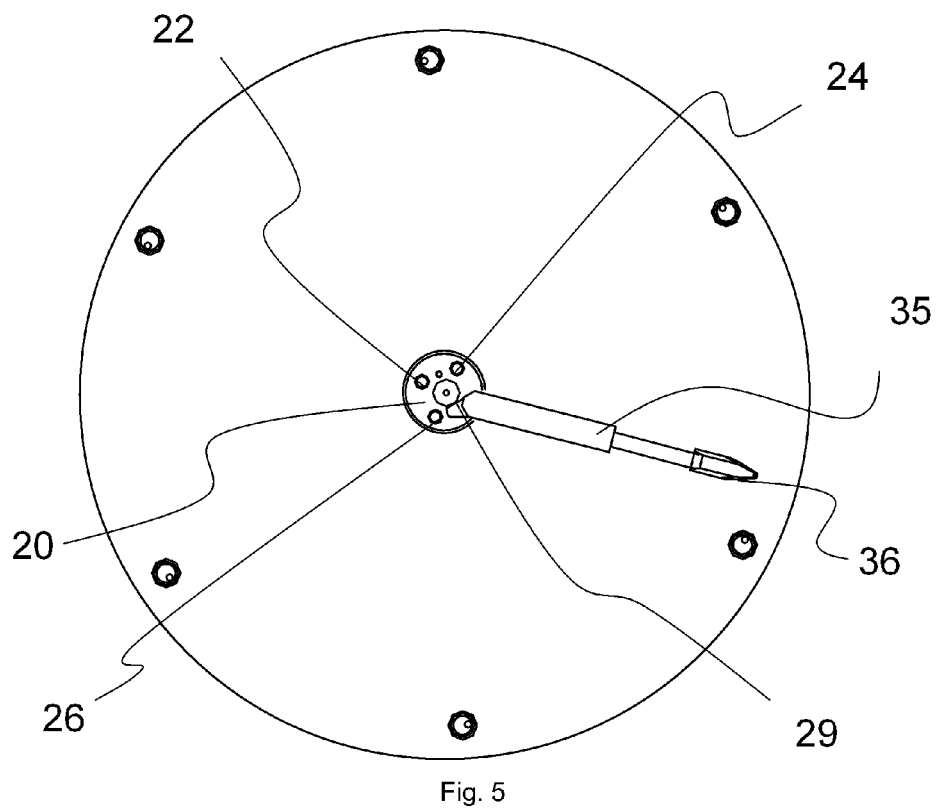
FIG. 5. shows an alternative embodiment of the apparatus according to the present invention in a top-view.

FIG. 5 shows another embodiment of the invention, wherein the nozzle arm 35 carries only one inner edge nozzle 36.

The invention claimed is:

1. Apparatus for wet treatment of a single disc-like article comprising:
   a spin chuck for holding and rotating a disc-like article of a predetermined radius (ra), and two inner edge nozzles each dispensing treatment liquid directed towards a first peripheral region of a first surface of the disc-like article when held by the spin chuck,
   wherein the first surface is facing the spin chuck and the first peripheral region is defined as being a region of the first surface extending from an inner radius (ri) to the predetermined radius (ra) of the disc-like article, and having a radial extent which is greater than 1 cm and less than said predetermined radius (ra),
   wherein each of said two inner edge nozzles is positioned in a stationary manner between the disc-like article (when placed on the spin chuck) and the spin chuck,
   wherein each of said two inner edge nozzles is fed through a central pipe, which is disposed in a stationary manner and penetrates centrally through the spin chuck, and
   wherein each of the two inner edge nozzles communicates with a supply of a respectively different treatment liquid, so that different liquids can be supplied simultaneously through said two inner edge nozzles without intermixing of the different liquids prior to exiting said two inner edge nozzles.

2. Apparatus according to claim 1, wherein the spin chuck comprises at least two gripping elements projecting from the spin chuck for gripping the disc-like article at its edge.

3. Apparatus according to claim 1, wherein the central pipe and each of said two inner edge nozzles are connected by a radial pipe.

4. Apparatus according to claim 3, wherein the radial pipe simultaneously serves as the support of each of said two inner edge nozzles.

5. Apparatus according to claim 3, wherein said radial pipe supplies a treatment liquid from said central pipe to each of said two inner edge nozzles while causing said treatment liquid to bypass an inner region that is radially inward of the peripheral region.

6. Apparatus according to claim 1, further comprising an outer nozzle directed to a second surface of the disc-like article, which is not facing the spin chuck.

7. Apparatus according to claim 6, wherein the outer nozzle is movable mounted across the disc-like article.

8. Apparatus according to claim 6, wherein the outer nozzle is an outer edge nozzle dispensing treatment liquid directed towards a second peripheral region of the second surface of the disc-like article, wherein the second peripheral region is defined as being a region of the second surface with an inner radius, which is greater than 1 cm less than the disc-like article's radius.

9. Apparatus according to claim 1, wherein the axis of each of said two inner edge nozzles and the first surface include an angle $\alpha$ in a range of 5° to 85°.

10. Apparatus according to claim 1, wherein the axis of each of said two inner edge nozzles and the edge of the disc-like article include an angle $\beta$ in a range of 5° to 85°.

11. Apparatus according to claim 1, further comprising an agitation means for agitating the liquid flow directed to the first peripheral region, wherein the agitation means comprises at least one of the elements selected from the group of liquid flow guided laser beam, megasonic transducer, gas jet and two fluid jet.

12. Apparatus according to claim 1, comprising a gas purging device for supplying gas to the first surface of the disc-like article.

13. Apparatus according to claim 12, comprising two interior liquid nozzles.

14. Apparatus according to claim 1, further comprising an interior liquid nozzle for supplying liquid towards an inner region of the first surface of the disc-like article, the inner region being radially inward of the peripheral region.

* * * * *